(12) United States Patent
Sarma et al.

(10) Patent No.: US 7,799,486 B2
(45) Date of Patent: Sep. 21, 2010

(54) LITHOGRAPHY MASKS AND METHODS OF MANUFACTURE THEREOF

(75) Inventors: Chandrasekhar Sarma, Poughkeepsie, NY (US); Alois Gutmann, Poughkeepsie, NY (US); Henning Haffner, Pawling, NY (US); Sajan Marokkey, Wappingers Falls, NY (US); Josef Maynollo, Wappingers Falls, NY (US)

(73) Assignee: Infineon Technologies AG, Neubiberg (DE)

( * ) Notice: Subject to any disclaimer, the term of this patent is extended or adjusted under 35 U.S.C. 154(b) by 314 days.

(21) Appl. No.: 11/602,886

(22) Filed: Nov. 21, 2006

(65) Prior Publication Data

US 2008/0119048 A1     May 22, 2008

(51) Int. Cl.
*G03F 1/00* (2006.01)
(52) U.S. Cl. ......................................... 430/5
(58) Field of Classification Search ...................... 430/5
See application file for complete search history.

(56) References Cited

U.S. PATENT DOCUMENTS

| | | | |
|---|---|---|---|
| 4,701,940 A | 10/1987 | Soda et al. | |
| 4,961,634 A | 10/1990 | Chipman et al. | |
| 5,442,184 A | 8/1995 | Palmer et al. | |
| 5,559,583 A | 9/1996 | Tanabe | |
| 5,633,944 A | 5/1997 | Guibert et al. | |
| 5,815,247 A | 9/1998 | Poschenrieder et al. | |
| 5,922,513 A | 7/1999 | Jeon et al. | |
| 5,933,219 A | 8/1999 | Unno | |
| 6,122,103 A | 9/2000 | Perkins et al. | |
| 6,288,840 B1 | 9/2001 | Perkins et al. | |
| 6,322,957 B1 | 11/2001 | Yamamoto et al. | |
| 6,404,482 B1 | 6/2002 | Shiraishi | |
| 6,486,940 B1 | 11/2002 | Williamson | |
| 6,496,239 B2 | 12/2002 | Seiberle | |
| 6,522,483 B2 | 2/2003 | Kreuzer | |
| 6,552,808 B2 | 4/2003 | Millerd et al. | |
| 6,605,395 B2 * | 8/2003 | Grobman et al. | 430/5 |
| 6,630,289 B1 | 10/2003 | Kwok et al. | |
| 6,943,941 B2 | 9/2005 | Flagello et al. | |
| 6,965,484 B2 | 11/2005 | Shaver | |
| 6,970,233 B2 | 11/2005 | Blatchford | |
| 6,972,906 B2 | 12/2005 | Hasman et al. | |
| 6,992,750 B2 | 1/2006 | Kawashima et al. | |
| 7,009,686 B2 | 3/2006 | Kawashima et al. | |

(Continued)

OTHER PUBLICATIONS

Bailey, G.E., et al., Polarization Influences through the Optical Path, Optical Microlithography XVIII, 2005, pp. 1102-1112, Proceedings of the SPIE, vol. 5754, SPIE, Bellingham, WA.

(Continued)

*Primary Examiner*—Mark F Huff
*Assistant Examiner*—Jonathan Jelsma
(74) *Attorney, Agent, or Firm*—Slater & Matsil, L.L.P.

(57) ABSTRACT

Lithography masks and methods of manufacture thereof are disclosed. A preferred embodiment comprises a method of manufacturing a lithography mask. The method includes providing a substrate, forming a first pattern in a first region of the substrate, and forming a second pattern in a second region of the substrate, the second pattern comprising patterns for features oriented differently than patterns for features of the first pattern. The method includes affecting a polarization rotation of light differently in the first region than in the second region of the substrate.

30 Claims, 6 Drawing Sheets

U.S. PATENT DOCUMENTS

| | | | |
|---|---|---|---|
| 7,031,077 | B2 | 4/2006 | Kreuzer |
| 2002/0027624 | A1 | 3/2002 | Seiberle |
| 2002/0068227 | A1 | 6/2002 | Wang et al. |
| 2004/0245439 | A1 | 12/2004 | Shaver |
| 2005/0048377 | A1* | 3/2005 | Yang .............................. 430/5 |
| 2005/0099613 | A1 | 5/2005 | Fukuhara |
| 2005/0105180 | A1* | 5/2005 | Mackey ....................... 359/500 |
| 2005/0255389 | A1* | 11/2005 | Tange et al. .................... 430/5 |
| 2006/0083996 | A1 | 4/2006 | Kim |
| 2006/0177745 | A1* | 8/2006 | Huh et al. ....................... 430/5 |
| 2007/0264581 | A1 | 11/2007 | Schwarz |

OTHER PUBLICATIONS

Kondru, R.K., et al., "Atomic Contributions to the Optical Rotation Angle as a Quantitative Probe of Molecular Chirality," Science Magazine, Dec. 18, 1998, pp. 2247-2250, vol. 282, No. 5397, Science/AAAS, Washington, DC.

"Polarization," Wikipedia, the free encyclopedia, http://en.wikipedia.org/wiki/Polarization, downloaded Apr. 27, 2006, 12 pp., Wikimedia Foundation Inc., St. Petersburg, FL.

Wang, R., et al., "Polarized Phase Shift Mask: Concept, Design, and Potential Advantages to Photolithography Process and Physical Design," 21st Annual BACUS Symposium on Photomask Technology, 2002, pp. 406-417, Proc. SPIE, vol. 4562, SPIE, Bellingham, WA.

Wolf, S., et al., "Silicon Processing for the VLSI Era: Vol. 1: Process Technology," 2nd Ed., 2000, pp. 625-626, Lattice Press, Sunset Beach, CA.

Yu, G., et al., "Resolution Enhancement in Optical Lithography Using Polarized Film Mask," Fifth International Conference on Thin Film Physics and Applications, 2004, pp. 567-570, Proc. of SPIE, vol. 5774, SPIE, Bellingham, WA.

Yu, G., et al., "Resolution Enhancement in Optical Lithography with Chromium Wire-grid Polarization Mask," Advanced Microlithography Technologies, 2005, pp. 122-129, Proceedings of SPIE, vol. 5645, SPIE, Bellingham, WA.

* cited by examiner

LITHOGRAPHY MASKS AND METHODS OF MANUFACTURE THEREOF

TECHNICAL FIELD

The present invention relates generally to the fabrication of semiconductor devices, and more particularly to lithography masks used to pattern material layers of semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (ICs). There may be a plurality of transistors, memory devices, switches, conductive lines, diodes, capacitors, logic circuits, and other electronic components formed on a single die or chip, for example.

Optical photolithography involves projecting or transmitting light through a pattern comprised of optically opaque areas and optically clear or transparent areas on a mask or reticle. For many years in the semiconductor industry, optical lithography techniques such as contact printing, proximity printing, and projection printing have been used to pattern material layers of integrated circuits. Lens projection systems and transmission lithography masks are used for patterning, wherein light is passed through the lithography mask to impinge upon a photosensitive material layer disposed on a semiconductor wafer or workpiece. After development, the photosensitive material layer is then used as a mask to pattern an underlying material layer. The patterned material layers comprise electronic components of the semiconductor device.

There is a trend in the semiconductor industry towards scaling down the size of integrated circuits, to meet the demands of increased performance and smaller device size. However, as features of semiconductor devices become smaller, it becomes more difficult to pattern the various material layers because of diffraction and other effects that occur during a lithography process. Lithography techniques such as immersion lithography and EUV lithography have been developed or are currently under development to address the lithography challenges of decreased feature sizes. Immersion lithography is expected to enable the numerical aperture (NA) of the projection lens system to be greater than 1, for example.

A recent development in lithography is the use of polarized light for the exposure process. Problems resulting from the polarization of light and benefits arising from the intentional use of polarized light have become matters of interest, particularly with high NA patterning, such as in immersion lithography.

What are needed in the art are lithography masks and methods of manufacture thereof that are effective in exposure processes involving polarized light.

SUMMARY OF THE INVENTION

These and other problems are generally solved or circumvented, and technical advantages are generally achieved, by preferred embodiments of the present invention which provide novel lithography masks and methods of manufacture thereof.

In accordance with a preferred embodiment of the present invention, a method of manufacturing a lithography mask includes providing a substrate, forming a first pattern in a first region of the substrate, and forming a second pattern in a second region of the substrate. The second pattern comprises patterns for features oriented differently than patterns for features of the first pattern. A polarization rotation of light is affected differently in the first region than in the second region of the substrate.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
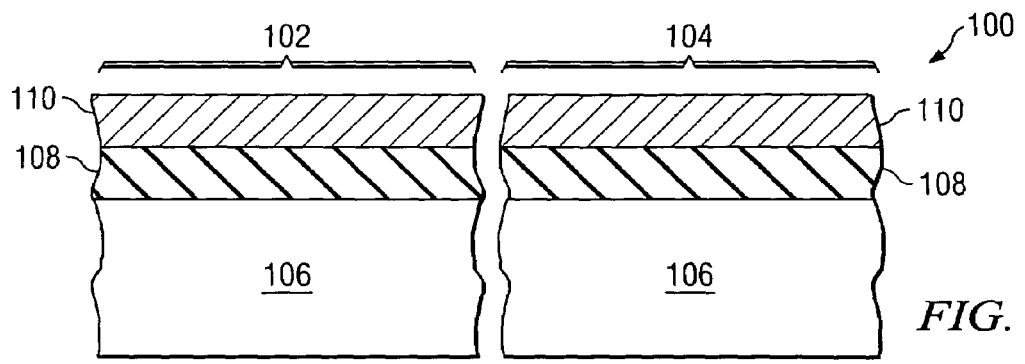
FIGS. 1 and 2 show cross-sectional views of a binary lithography mask in accordance with a preferred embodiment of the present invention at various stages of manufacturing.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In some applications, the use of polarized light can enhance the imaging process in lithography. However, the direction of polarization that is best suited for some features, e.g., horizontal features is not necessarily best suited for other features, e.g., vertical features. Thus, a global definition of the polarizing state of the illuminating light may not be sufficient for optimum imaging performance in some lithography processes.

For example, for a horizontal feature, an exposure process using polarized light in a horizontal direction is preferred. An exposure process for horizontal features using polarized light in a vertical direction may result in poor contrast and poor resolution of horizontal features formed on a semiconductor device, for example. In many applications, it is desirable for horizontal features formed on a semiconductor device to comprise the same dimensions as vertical features, in order to achieve the same operating parameters and electrical characteristics. As an example, if the features comprise transistor gates, for example, the widths of the gates largely impact the operating parameters of the transistors, e.g., the current and voltage.

However, due to the use of polarized light in the exposure process, features in a horizontal orientation may comprise different dimensions than features in a vertical orientation. Features comprising different dimensions in some semiconductor applications are disadvantageous because devices formed have non-uniform performance and operating characteristics, resulting in decreased and unpredictable device performance, decreased yields, and increased manufacturing costs, for example.

To alleviate this problem, a double exposure process is sometimes used to form horizontal features and vertical features, using a first polarized light and a second polarized light polarized differently than the first polarized light. However, a double exposure process requires two masks and two exposure processes, which is costly and time-consuming.

Embodiments of the present invention achieve technical advantages by providing lithography mask designs and methods of manufacture thereof wherein a single exposure process may be used to form features oriented in different directions on a semiconductor device. The present invention will be described with respect to preferred embodiments in a specific context, namely in lithography masks used to pattern semiconductor devices. The invention may also be applied, however, to masks used to pattern other types of devices in other applications and other technological fields, for example.

Embodiments of the present invention utilize polarizing properties of light to image at least two patterns oriented on different axes with a high contrast using a single exposure and a single mask in a lithography system. Two polarizing materials are used to alter the polarization of the light through a lithography system: a polarization filter that is disposed on a mask, pellicle, or other locations in the optical path of the lithography system, and a polarization rotating material adapted to rotate the polarization of the light emitted from the polarization filter in some regions of the mask. The polarization filter may comprise a linear polarizing illumination system in some embodiments, e.g., wherein the source of a lithography system emits polarized light. The polarization filter allows only one orientation of polarizing light to pass through it, while the active polarization rotating material rotates the orientation of the polarized light emitted from the polarization filter by 90 degrees or other angles corresponding to the feature orientation of the particular device design.

Figure 2:
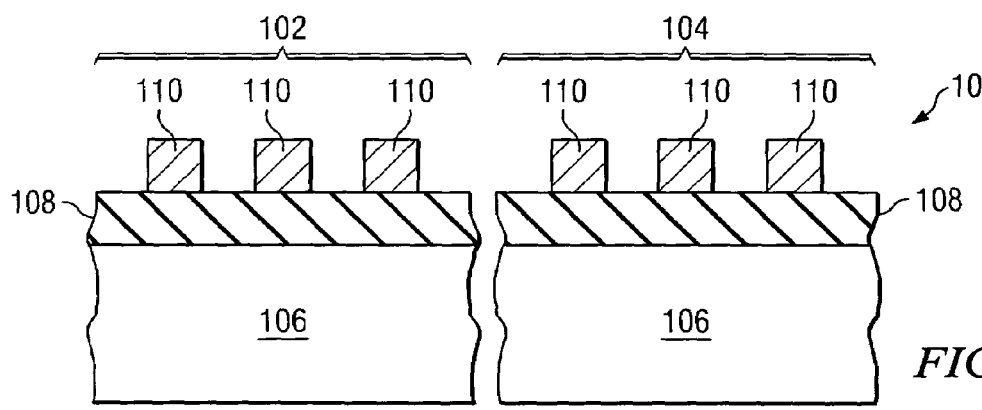
Figure 4:
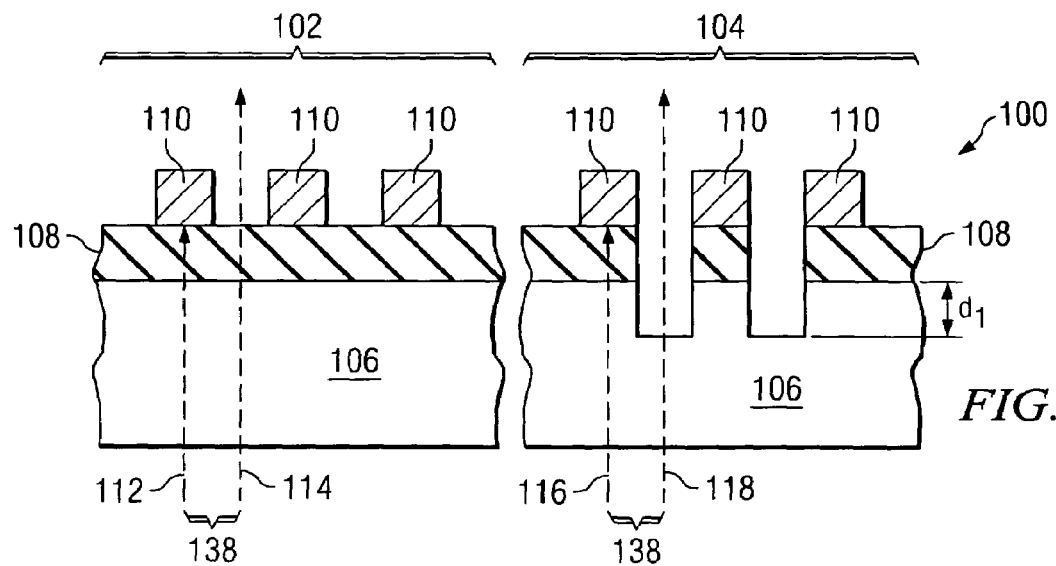
FIG. 4 shows the lithography mask of FIGS. 2 and 3 in a cross-sectional view after an absorber layer of the mask has been patterned across the entire lithography mask and certain portions of material layers of the mask have been removed in one region.

FIGS. 1, 2, and 4 show cross-sectional views of a lithography mask in accordance with a preferred embodiment of the present invention at various stages of manufacturing. With reference now to FIG. 1, first, a substrate 106 is provided. The substrate 106 preferably comprises a transparent material such as quartz, although alternatively the substrate 106 may comprise other materials, such as glass, as an example. The substrate 106 preferably comprises a thickness of about ¼ inch, for example, although alternatively, the substrate 106 may comprise other dimensions.

A polarization rotating material 108 is formed over at least some areas of the substrate 106, and in some embodiments, not over other areas of the substrate 106. The substrate 106 may be recessed in the areas not having the polarization rotating material 108 formed thereon in some embodiments. The polarization rotating material 108 may be disposed in at least a first region 102 of the substrate 106, the polarization rotating material being adapted to alter a polarization and a phase of light in at least the first region 102, for example. The mask 100 may include a phase shifting compensating feature disposed in at least portions of a second region 104 of the substrate 106, the phase shifting compensating feature comprising recesses in the substrate 106 adapted to compensate for the altered phase of light due to the polarization rotating material 108 in the first region 102, for example, to be described further herein.

To form the polarization rotating material 108, the polarization rotating material 108 may be disposed over the substrate 106. The polarization rotating material 108 preferably comprises a material adapted to alter or rotate the polarization orientation of polarized light passing from the substrate 106 through the polarization rotating material 108, for example. In some embodiments, the polarization rotating material 108 is adapted to rotate polarized light by about 90 degrees, for example. The polarization rotating material 108 may comprise a layer of active polarizing materials, e.g., a 90 degree polarizer. In other embodiments, the polarization rotating material 108 is adapted to rotate polarized light at an angle having a range from about 0 to 180 degrees, for example. The angle of rotation is preferably selected to correlate to the orientation of features to be formed on a semiconductor device in a particular region 102 or 104 of the mask 100, for example.

The polarization rotating material 108 preferably comprises a birefringent material and/or an optically active material of an inorganic or organic nature, as examples. The polarization rotating material 108 of the lithography mask 100 preferably comprises $SiO_2$, $CaCO_3$, $TiO_2$, $\beta\text{-}BaB_2O_4$, a cholesteric liquid crystal film with a helical structure, an optically active alicyclic polymer, an optically active siloxane, other optically active organic materials or compounds with a high transmission to the exposure wavelength used, or fluorine-containing organic materials, as examples. When using 193 nm light for an exposure process, the polarization rotating material 108 may comprise an alicyclic polymer with optical activity induced by the chemical composition and/or structure of the polymer chain and/or its side-groups, for example. Alternatively, the polarization rotating material 108 may comprise other materials.

The polarization rotating material 108 preferably comprises a thickness of about 50 to 300 nm or less, which advantageously may be reproducibly achieved by conventional deposition or coating techniques established in semiconductor device and mask manufacturing processes, for example. Alternatively, however, the polarization rotating material 108 may comprise other dimensions.

A pattern-forming material 110 is disposed over the polarization rotating material 108, as shown in FIG. 1. In some embodiments, first the pattern-forming material 110 is disposed over the substrate 106, and then the polarization rotating material 108 is disposed over the pattern-forming material 110, for example, not shown in the figures. The pattern-forming material 110 comprises a material layer comprising an absorber or an attenuating material in some embodiments.

In the embodiment shown in FIGS. 1 through 4, the pattern-forming material 110 comprises an absorbing material or an absorber. The pattern-forming material 110 preferably comprises chromium (Cr) in some embodiments, although alternatively, the pattern-forming material 110 may comprise other materials. The pattern-forming material 110 preferably comprises a thickness of about 50 to 100 nm or less, although alternatively, the pattern-forming material 110 may comprise other dimensions.

The lithography mask 100 comprises a first region 102 and a second region 104, as shown. The first region 102 comprises a region where the patterns for features are oriented in a first direction requiring a polarization at a first orientation or a first angle, e.g., 90 degrees or other angles. The second region 104 comprises a region where patterns for features are oriented in a second direction requiring a polarization at a second orientation or second angle, e.g., 0 degrees or other angles. The first angle is different than the second angle, and the first orientation of features in the first region 102 is different than the second orientation of features in the second region 104, for example. The difference in the first angle and the second angle may comprise any angle between 0 and 180 degrees in principle, although for the majority of practical applications the first angle and the second angle may be orthogonal to one another (e.g., 90 degrees).

Figure 3:
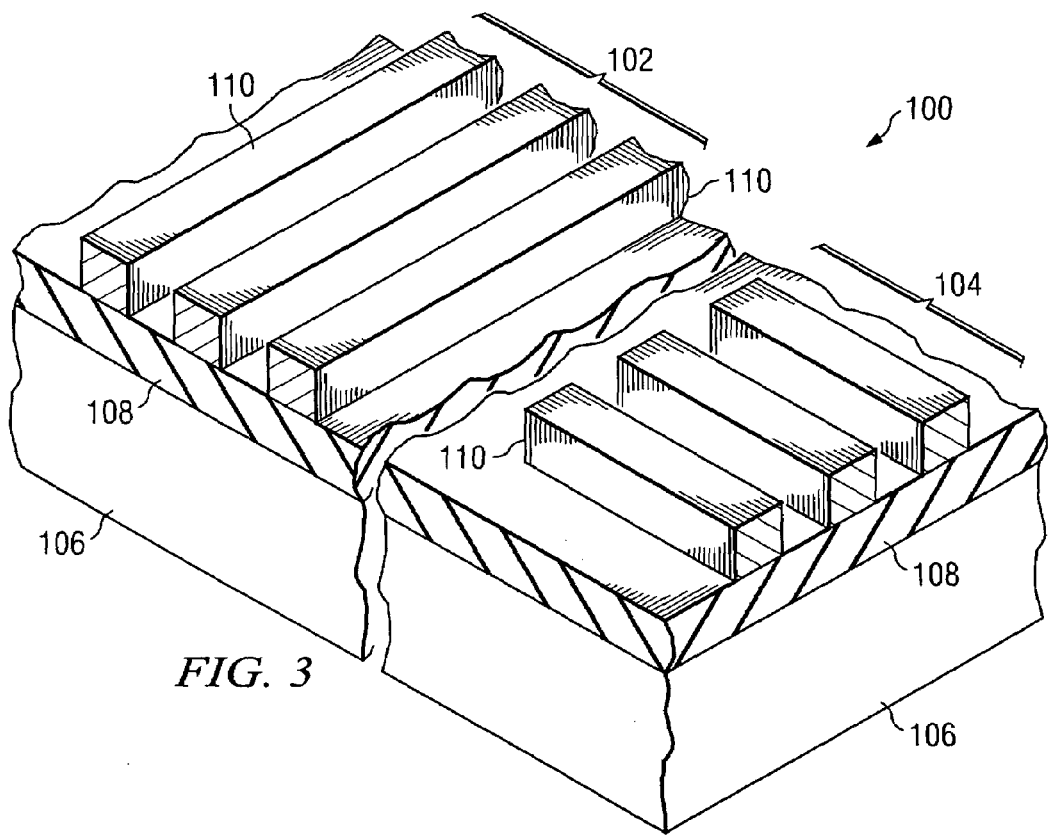
FIG. 3 shows the lithography mask of FIG. 2 in a perspective view.

The pattern-forming material 110 is patterned with a pattern for features in the first region 102 and the second region 104, as shown in FIG. 2. Note that the patterned pattern-forming material 110 is shown wherein the features are oriented the same in the first region 102 and the second region 104 in FIG. 2; however, the patterns in the pattern-forming material 110 are actually oriented differently. For example, as shown in FIG. 3 in a perspective view, region 104 is shown rotated by the second angle less the first angle as compared to region 102, e.g., wherein the angle is about 90 degrees in the perspective view of FIG. 3.

The polarization rotating material 108 and a portion of the substrate 106 in the second region 104 are then patterned with the pattern of the pattern-forming material 110, as shown in FIG. 4. Using the previously patterned absorber material (e.g., the pattern-forming material 110) as a hard mask, the polarization rotating material 108 may be etched away by an anisotropic dry etch process or other type of etch process, for example, in the absorber-free mask portions of the second region 104. In addition, the top or upper portion of the substrate 106 immediately beneath the interface of the substrate 106 to layer 108 may be recessed to a predetermined depth $d_1$, to be explained further herein, again using an anisotropic dry etch process or other etch process, for example. Locally selective removal of the polarization rotating material 108 and recess of the substrate in region 104 may preferably be carried out in sequence in the same dry etch chamber, for example. The choice of the etch chemistry or mixture is a function of the chemical nature of the absorber 110 material and the polarization rotating material 108 used, e.g., to achieve suitable etch selectivity in the etch process.

During removal of the polarization rotating material 108 and a potentially required substrate 106 recess by an amount $d_1$ in the second region 104, the first region 102 is preferably protected, e.g., by a photoresist layer (not shown) placed over the first region 102 by a conventional block level lithography approach. After completion of the etching of a portion of the substrate 106 in the second region 104, the photoresist layer covering the region 102 is removed, using a wet or dry resist strip method, as examples.

FIG. 4 also shows the effect on light 138 transmitted by an illuminator (not shown in FIG. 4: see FIG. 5 at 122) impinged upon the novel lithography mask 100 of embodiments of the present invention in various areas 112, 114, 116, and 118 of the mask 100. Light 138 passes through areas 114 and 118 not having the pattern-forming material 110 disposed thereon, and light 138 is blocked in areas 112 and 116 where the pattern-forming material 110 resides. To achieve 0 degree polarization rotation in the second region 104, the polarization rotating material 108 is etched away from the areas 118 not covered by the pattern-forming material 110, to ensure that light 138 emerging out of the second region 104 (i.e., in area 118) is polarized differently than light 138 emerging out of the first region 102 (i.e., in area 114).

However, the polarization rotating material (PRM) 108 in the first region 102 may contribute in some embodiments to an additional phase change of (PPRM in light 138 passing through area 114, thereby affecting the nature of the interference between light emitted from regions 102 and 104 in a possibly undesired manner. Such potentially undesirable interference effects will not occur if the polarization rotating material 108 induces a rotation of the polarization plane by 90 degrees, because light beams with polarization planes orthogonally aligned to each other will not interfere. However, for all other rotation angles deviating from 90 degrees, it is recommendable and preferable in accordance with some embodiments of the present invention to eliminate a phase difference between light emitted from areas 114 and 118 by compensating for the phase change in areas 114 due to the presence of the polarization rotating material 108 in region 102 by an accompanying offset in phase for the light passing through areas 118 of region 104.

Thus, in accordance with embodiments of the present invention, as a corrective measure, an additional phase change may be achieved on the transmitting light 138 through area 118 by over-etching or recessing the substrate 106 by an amount $d_1$, as shown in FIG. 4. The recess amount $d_1$ of the substrate 106 is also referred to herein as $t_R$ in the equations that follow, for example. Recessing the substrate 106 by a predetermined amount $d_1$ advantageously may result in the elimination of a phase difference between area 114 (light transmitted through the first region 102) and area 118 (light transmitted through the second region 104), e.g., preferably establishing a phase difference of 0 or a multiple of $2\pi$ between areas 114 and 118, in some embodiments.

The light 138 is polarized in a predetermined direction, e.g., in the embodiment shown in FIG. 4, the incident light 138 is linearly polarized. In the first region 102, in areas 114 where the pattern-forming material 110 does not reside, light 138 passes through the polarization rotating material 108 between the pattern-forming material 110 in areas 112. The polarization of the light 138 is changed due to the polarization rotating material 108 in area 114 in the first region 102. In addition, the phase of the light 138 may also be altered by the presence of the polarization rotating material 108 by a predetermined amount of phase $\phi_{PRM}$ which is determined by the thickness $t_{PRM}$ of the polarization rotating material 108, the refractive index $n_{PRM}$, of the polarization rotating material 108, and the exposure wavelength $\lambda$ applied. On the other hand, in areas 118 in region 104 where the pattern-forming absorber material 110 and the polarization rotating material 108 do not reside, light 138 passes through only the substrate 106. Thus, a rotation of the direction of the polarization plane of the light 138 does not occur in areas 118.

In accordance with preferred embodiments of the present invention, a portion of the substrate 106 is removed in areas 118 in order to offset the amount of phase shift $\phi_{PRM}$ due to the polarization rotating material 108 in the other areas 112, 114, and 116. For example, the substrate 108 is preferably removed in areas 118 to a recess depth $t_R$ or $d_1$ to achieve a phase shift $\phi_R$ due to the change in material thickness of the substrate 106 in areas 118.

The required amount $d_1$ or $t_R$ of overetch or recess into the substrate 106 in areas 118 of region 104 can be determined as follows. In order to achieve an absence of a phase difference between the light 138 passing through areas 114 of region 102 and light 138 passing through areas 118 of region 104, the difference in the length of the optical paths must be either 0 or a multiple of the wavelength $\lambda$ of the light 138 used for exposure. This requirement can be expressed by the Equation 1:

$$t_{PRM}(n_{PRM}-n_a)+t_R(n_s-n_a)=n\lambda;\quad \text{Eq. 1:}$$

for n=0 or 1, wherein $t_{PRM}$ is the thickness of the polarization rotating material 108, wherein $t_R$ is the depth or dimension $d_1$ of the recess into the substrate 106 in region 104, wherein $\lambda$ is the exposure wavelength of the light 138, and wherein $n_{PRM}$, $n_s$ and $n_a$ are the refractive indices of the polarization rotating material 108, the mask substrate 106, and the gas ambient surrounding the mask 100 during operation in the exposure tool, respectively. Solving Equation 1 for the variable $t_R$ results in Equation 2 that may be used to calculate the required recess depth $t_R$ of the substrate 106, as follows:

$$t_R=[t_{PRM}(n_{PRM}-n_a)-n\lambda]/(n_s-n_a).\quad \text{Eq. 2:}$$

Thus, by selecting an appropriate recess depth $t_R$ of the substrate 106 in areas 118 to avoid any phase difference in the optical paths through areas 114 and 118, a degradation of the imaging quality into a photosensitive material layer on a semiconductor device can be prevented when the lithography mask 100 containing a polarization rotating material 108 is used for patterning in a lithography process, resulting in improved pattern transfer.

Differences in light diffraction or light scattering behavior between the first region 102 and the second region 104 due to the presence of trenches through the polarization rotating material 108 and the recess ($t_R$ or $d_1$) in the substrate 106 in the second region 104, and the absence of such trenches in the first region 102, can be compensated for by adjustments in mask 100 critical dimensions (CD) or slight deviations from the theoretical etch depth $t_R$ in the substrate 106 in the second region 104, as examples.

In the lithography mask 100 shown in FIG. 4, for example, the pattern of the pattern-forming material 110 is the pattern that is transferred to a material layer of a semiconductor device using a positive photoresist, for example. Thus, lines or features formed on a material layer of a semiconductor device appear as the patterns of the absorber material 110 shown in FIG. 4, for example.

The lithography mask shown in FIG. 4 comprises a binary or chrome-on-glass (COG) mask. Embodiments of the present invention may also be adapted to other types of lithography masks, such as attenuated (halftone) or alternating PSMs, and other types of masks, as examples. The manufacturing of non-COG masks containing polarization rotating materials, however, is in general more complex, compared to the implementation of a polarization rotating material 108 in a binary or COG mask 100 as shown in FIGS. 1 through 4. Examples of manufacturing schemes for attenuated PSMs implementing embodiments of the present invention will be later described further herein.

Advantageously, the rotational angle of the polarization rotating material 108 may be changed by adjusting the thickness of the polarization rotating material 108. The ability to adjust the angle by adjusting the polarization rotating material 108 thickness $t_{PRM}$ enables the patterning of orthogonal and non-orthogonally aligned regions of features across a semiconductor device. Thus, two or more regions of features may be formed comprising two or more orientations, e.g., wherein features extend lengthwise at varying angles from region to region, e.g., from a first region 102 to a second region 104.

As an example, features formed on semiconductor devices may be aligned in an x direction in region 102 and in a y direction in region 104. Features formed on semiconductor devices may be aligned along an axis in region 102, and features may be formed along an axis at an angle of 60 degrees, or in principle at any other angle between about 0 to 180 degrees, relative to the axis of region 102, in region 104.

Figure 6:
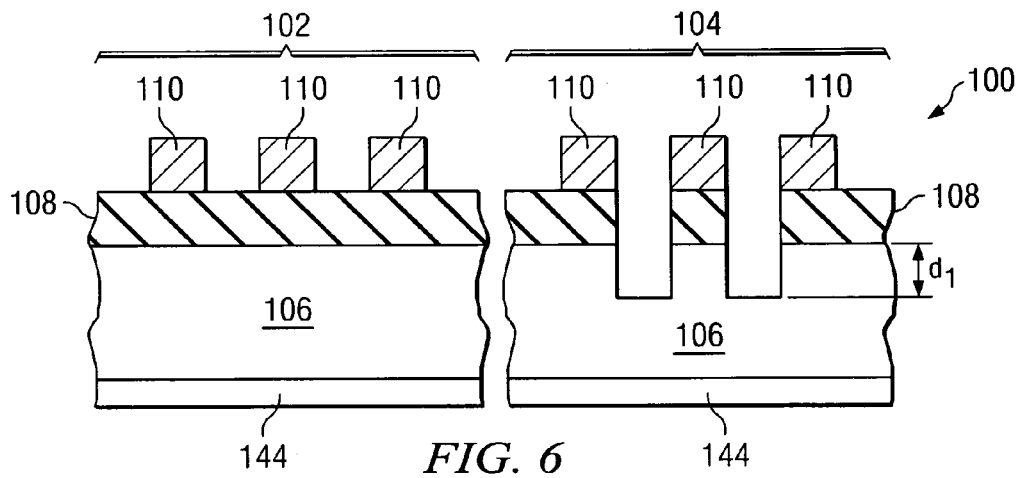
FIG. 6 shows a cross-sectional view of a binary lithography mask in accordance with another preferred embodiment of the present invention.

Note that in some embodiments, an optional polarization filter material layer 144 may be included in the mask 100, thereby eliminating the need for the availability of polarized light in the illumination system. For example, FIG. 6 shows a lithography mask 100 in accordance with embodiments of the present invention that includes a polarization filter material layer 144 disposed on the backside of the substrate 106. Alternatively, the polarization filter material layer 144 may also be placed or disposed between the polarization rotation film 108 and the substrate 106, for example, not shown. The optional polarization filter material layer 144 will be described in more detail further herein.

Referring again to FIG. 1, preferred materials for the polarization rotating material 108 will next be described. In some embodiments, the polarization rotating material 108 preferably comprises a birefringent material, for example. Passage of linearly polarized light through a properly oriented "plate" or layer (e.g., the layer of polarization rotating material 108) of birefringent material may be utilized to obtain a rotation of the plane of polarization of the light 138 shown in FIG. 4. As one example, for a rotation by 90 degrees, e.g., a half wave plate is required, corresponding to a difference of a half wavelength in the optical path between an ordinary ray and an extraordinary ray of the incident light 138. In accordance with embodiments of the present invention, the plate thickness or the thickness L of the polarization rotating material 108 needed to achieve a rotation by an angle $\Delta\theta$ can be calculated using Equation 3:

$$L=(\Delta\theta)\lambda/\pi(n_e-n_{or});\qquad\text{Eq. 3:}$$

wherein $n_e$ is the refractive index of the extraordinary ray of the light 138, $n_{or}$ is the refractive index of the ordinary ray of the light 138, and $\lambda$ is the wavelength of the polarized light 138.

Table 1 shows exemplary birefringent materials that may be used for the polarization rotating material 108 in accordance with embodiments of the present invention. The materials shown in Table 1 have suitably high levels of birefringence and transmittance for the wavelengths of interest indicated in the table, for example. However, other birefringent materials may alternatively be used. In one embodiment, preferably the polarization rotating material 108 comprises calcite for light 138 having a wavelength of 248 nm, as an example. In another embodiment, the polarization rotating material 108 preferably comprises β-barium borate for light 138 having wavelengths of 193 nm or 248 nm, as another example. Advantageously, these exemplary birefringent materials that may be used for the polarization rotating material 108 in accordance with embodiments of the present invention are commercially available.

Si wafers to produce so-called "Mixed Orientation Substrate" (MOS) wafers desired for special semiconductor applications. In MOS wafers, a thin silicon dioxide layer is used as a "glue layer" between the mounted monocrystalline top layer and the monocrystalline substrate with a different crystallographic orientation. In accordance with embodiments of the present invention, a similar approach may be followed for the mounting of birefringent material 108 layers onto a mask substrate 106 of a lithography mask 100, for example.

In some embodiments, the polarization rotating material 108 preferably comprises an optically active material. Rotation of the polarization direction of light occurs in optically active materials due to non-symmetric arrangements of chemical bonds or groups of atoms, e.g., due to "chirality." Calculations of the contributions to optical rotation from individual atoms may be made using a theory of circular dichroism, for example. Contributions to the optical rotation are additive, but may vary in sign from atom to atom, for example. Similar materials may be used for the polarization rotating material 108 as are employed in liquid crystal displays (LCDs), such as cholesteric liquid crystal films with helical structures, which have shown a high rotational power of polarization, if the transmissiveness of the film is not found to be too high in the deep ultraviolet (DUV) range. The polarization rotating material 108 may also comprise alicy-

TABLE 1

| Material | Transmission Range (μm) | Wavelength (nm) | $n_{or}$ | $n_e$ | Δn | Thickness of half wave plate for polarization rotation by 90 degrees (nm) |
|---|---|---|---|---|---|---|
| Synthetic quartz (SiO$_2$) | 0.15-4 | 185 | 1.676 | 1.69 | 0.014 | 6900 |
| Synthetic quartz (SiO$_2$) | 0.15-4 | 193.6 | 1.66 | 1.673 | 0.013 | 7420 |
| Calcite (CaCO$_3$) | 0.22-1.9 | 200 | 1.9 | 1.6 | 0.3 | 320 |
| Calcite (CaCO$_3$) | 0.22-1.9 | 250 | 1.77 | 1.53 | 0.24 | 402 |
| rutile (TiO$_2$) | 0.43-6.2 | 590 | 2.616 | 2.903 | 0.287 | 336 |
| beta barium borate (β-BaB$_2$O$_4$) | 0.19-3.3 | 213 | 1.847 | 1.6746 | 0.172 | 561 |

Preferably, the polarization rotating material 108 comprises a higher transmittance to the wavelength of the light, which is possibly achievable for 193 nm applications by fluorine (F) incorporation into the birefringent materials, for example.

The polarization rotating material 108 is also referred to herein as a layer of birefringent material or a birefringent material. The integration of a layer of birefringent material 108 as part of the architecture of the mask 100 for the purpose of inducing the rotation of the polarization plane of incoming light represents a difficult but not insurmountable technical challenge. Thin plates of the birefringent material 108 may be cut out from a monocrystalline material piece of an appropriate size in a specific predetermined crystallographic orientation and mounted onto the mask substrate 106, for example. One method of achieving this is by utilizing a method similar to a Smart Cut™ by Silicon On Insulator Technologies method, for example. The Smart Cut™ method may be used to mount thin birefringent material 108 plates having a thickness ranging from between a few tens to a few hundreds of nm onto the mask substrate 106 in accordance with embodiments of the present invention, for example. Note that the Smart Cut™ technique has been successfully applied in industry for the mounting of thin monocrystalline (100) Si layers on (100)

clic polymers such as materials used in 193 nm resist chemistry, with optical active subunits either in the polymer chain or in ligands; e.g., a camphor or substituted adamanthane type. Fluorine incorporation into the organic materials may help to raise the transmissivity for wavelengths shorter than about 200 nm; e.g., the polarization rotating material 108 may comprise a fluorine-containing organic material. Alternatively, optically active siloxanes may also be used for the polarization rotating material 108, for example. Maximum values for Δn in colorless organic materials based on circular dichroism have been observed to be around 0.3, for example.

Figure 5:
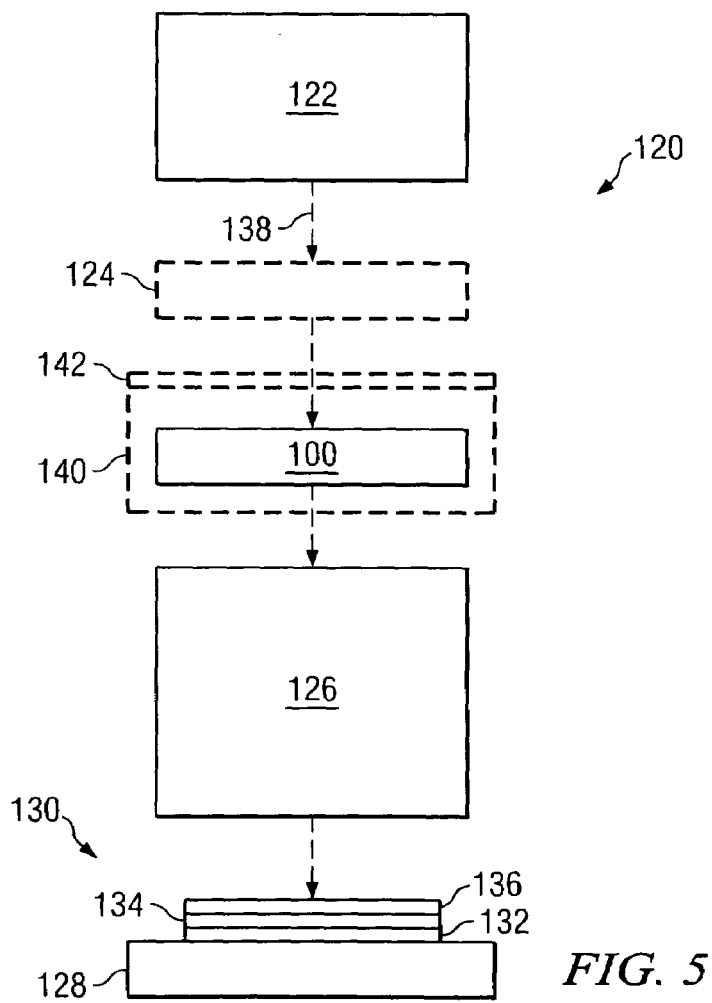
FIG. 5 shows a lithography system implementing a lithography mask of FIG. 4 in accordance with a preferred embodiment of the present invention.

FIG. 5 shows a lithography system 120 implementing a lithography mask 100 of FIG. 4. Embodiments of the present invention also include lithography systems 120 such as the one shown in FIG. 5 that utilize or include the lithography masks 100, 200, 300, 400, or 500 shown in FIG. 6, 9, 10, 11, or 15, respectively, as examples, which masks 100, 200, 300, 400, or 500 will be described further herein.

Referring to FIG. 5, the lithography system 120 includes a support or stage 128 for a semiconductor device 130 or workpiece and a projection lens system 126 disposed proximate the semiconductor device 130 support 128, as shown. The projection lens system 126 may include a plurality of lenses, e.g., not shown, and may include a fluid disposed between the semiconductor device 130 mounted on the support 128 and a last lens of the projection lens system 126, e.g., in an immersion lithography system, not shown. An illuminator 122 comprising an energy source, e.g., a light source, is disposed proximate the projection lens system 126.

A novel lithography mask 100 of embodiments of the present invention is disposed between the illuminator 122 and the projection lens system 126. The lithography mask 100 may comprise one mask in a mask set, not shown. The lithography mask 100 preferably includes a polarization rotating material 108 (not shown in FIG. 5; see FIG. 4) in at least one region that is adapted to alter or rotate polarized light 138 that impinges on the mask 100 in the region of the polarization rotating material 108 from the illuminator 122 to a predetermined type of polarization, and then direct the altered polarized light towards the support 128 for the semiconductor device 130 in some regions.

In some embodiments, the illuminator 122 is adapted to emit polarized light 138, for example. However, in other embodiments, the illuminator 122 emits unpolarized light 138, and then a polarizer is used elsewhere in the system 120 to polarize the light 138 before the light 138 enters the polarization rotating material 108 of the lithography mask 100 of embodiments of the present invention. For example, in FIG. 5, an optional polarizer 124 is shown in phantom disposed between the mask 100 and the illuminator 122. The polarizer 124 may comprise a polarizing filter adapted to polarize light 138 in a predetermined polarization, for example.

Alternatively, the lithography system 120 may include an optional pellicle 140 adapted to support the mask 100, as shown in phantom. Also optionally, the pellicle 130 may include a polarizer 142, also shown in phantom. The polarizer 142 of the pellicle 140 may comprise a polarizing filter adapted to polarize light 138 in a predetermined polarization, for example.

The lithography system 120 may comprise a lithography system that utilizes near ultraviolet (UV) or preferably deep ultraviolet (UV) light; e.g., light with wavelengths of 248 nm, 193 nm or 157 nm, although light having other wavelengths may also be used. The lithography system 120 may comprise a stepper or a step-and-scan apparatus, wherein the stage 128 is adapted to move the semiconductor device 130 while the mask 100 is moved in the exposure process, for example. The lithography system 120 may also be adapted for immersion lithography applications, for example, not shown.

In other embodiments of the present invention, rather than using linearly polarized illumination or light 138, a polarization filter 144 may be incorporated in the mask 100, as shown in FIG. 6, which shows a cross-sectional view of a lithography mask 100 in accordance with additional preferred embodiments of the present invention. For example, a polarizing filter material layer 144 may be disposed on the back of the mask 100 as shown in FIG. 6; e.g., on an opposite side of the mask 100 from the polarization rotating material 108. Alternatively, the polarizing filter material layer 144 may be disposed between the polarization rotating material 108 and the mask substrate 106 (not shown).

In the embodiment shown in FIG. 6, preferably, the polarizing filter material layer 144 is adapted to polarize light 138 in a first polarization orientation, and the polarization rotating material 108 is adapted to alter light after it passes through the polarizing filter material layer 144 to a second polarization orientation in the first region 104 of the mask 100, for example. Thus, the pattern of the lithography mask 100 is transferred to a device using a second polarization orientation in the first region 102 and using a first polarization orientation in the second region 104, for example. The light 138 entering the first region 104 is first polarized by the polarizing filter material layer 144 and then in addition the orientation of its plane of polarization is rotated while passing through the polarization rotating material 108.

The polarizing filter material layer 144 and/or the optional polarizers 124 or 142 of the lithography system 120 may comprise patterned gratings: e.g., comprising sub-resolution assist features (SRAF) too small to be printed on a semiconductor device, in some embodiments. The polarizing filter material layer 144 and/or the optional polarizers 124 or 142 may comprise a thin material layer, gratings utilizing absorbing materials, transparent foil materials, or similar polarizers that are attached to, integrated into, or mounted to the mask 100 or are located in the optical path in the lithography system 120, for example.

In yet another embodiment of the present invention, the order of the deposition of the pattern-forming material 110 and the polarization rotating material 108 may be reversed, for example (not shown in the drawings). Referring again to FIGS. 1 through 4, the pattern-forming material 110 may be deposited directly over the substrate 106, and the polarization rotating material 108 may be deposited over the pattern-forming material 110. The polarization rotating material 108 and the pattern-forming material 110 are then patterned and the substrate 106 is over-etched to compensate for the phase shift due to the presence of the polarization rotating material 108. Thus, a plurality of patterns for features may be formed in an attenuating or opaque material 110 disposed over or under the polarization rotating material 108, for example.

Thus, embodiments of the present invention comprise methods of using polarized light created by different means along the illumination path or optical path of a lithography system. The polarized light may be locally directionally rotated to be the most beneficial for a particular process window corresponding to the orientation of individual design features, in order to obtain a high contrast image, by means of an additional polarization rotating material 108 layer on the mask 100 and by a location dependent thickness adjustment of the substrate 106 of the mask 100.

Figure 7:
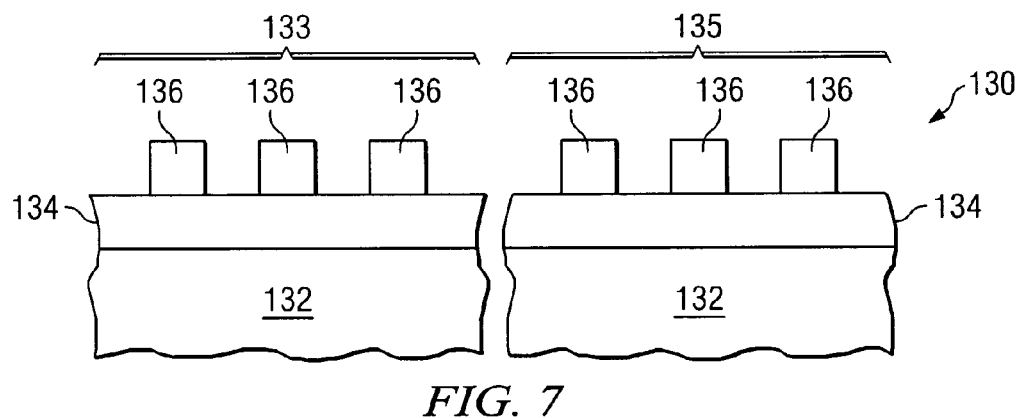
FIG. 7 shows a cross-sectional view of a semiconductor device that has a layer of photoresist disposed thereon that has been patterned using a lithography mask of an embodiment of the present invention.
Figure 8:
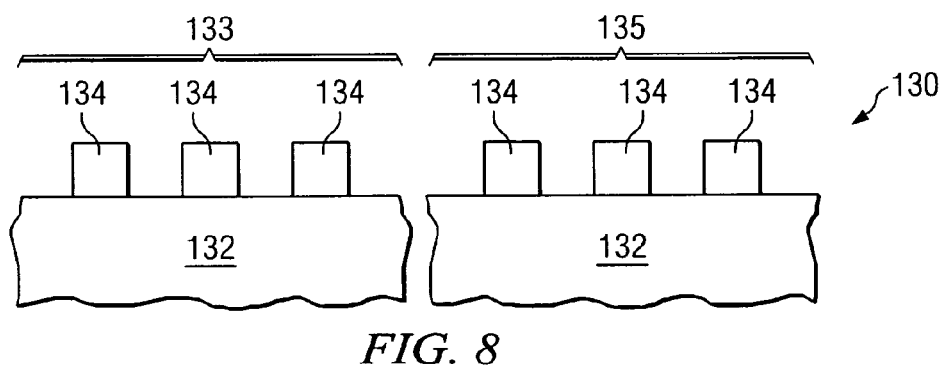
FIG. 8 shows the semiconductor device of FIG. 7 after the layer of photoresist has been used as a mask to pattern a material layer of the semiconductor device.

Embodiments of the present invention include methods of manufacturing semiconductor devices and devices manufactured using the novel lithography masks 100 described herein. FIG. 7 shows a cross-sectional view of a semiconductor device 130 that has a layer of photoresist 136 disposed thereon that has been patterned using a lithography mask 100 of an embodiment of the present invention. FIG. 8 shows the semiconductor device 130 of FIG. 7 after the layer of photoresist 136 has been used as a mask to pattern a material layer 134 of the semiconductor device 130.

Referring to FIG. 7, the semiconductor device 130 includes a workpiece 132. The workpiece 132 may include a semiconductor substrate comprising silicon or other semiconductor materials covered by an insulating layer, for example. The workpiece 132 may also include other active components or circuits, not shown. The workpiece 132 may comprise silicon oxide over single-crystal silicon, for example. The workpiece 132 may include other conductive layers or other semiconductor elements, e.g., transistors, diodes, etc. Compound semiconductors, GaAs, InP, Si/Ge, or SiC, as examples, may be used in place of silicon. The workpiece 132 may comprise a silicon-on-insulator (SOI) substrate, for example.

The workpiece 132 may comprise regions 133 where features will be formed in a first orientation and regions 135 where features will be formed in at least one second orientation. In some embodiments, the first orientation and a second orientation may comprise a vertical direction and/or a horizontal direction, the horizontal direction being substantially perpendicular to the vertical direction, for example. The vertical direction and the horizontal direction comprise directions on a planar surface of the workpiece 132, for example, that are substantially perpendicular to one another. The first orientation and the at least one second orientation may comprise other non-perpendicular directions and may comprise three or more directions, for example, not shown.

In a preferred embodiment of the present invention, a method of fabricating the semiconductor device 130 includes first, providing the workpiece 132. A material layer 134 to be patterned is deposited over the workpiece 132. The material layer 134 may comprise a conductive, insulating, or semiconductive material, or multiple layers or combinations thereof, as examples. In some embodiments, the material layer 134 preferably comprises a semiconductive material such as silicon or polysilicon, for example, although other materials may also be used. In an embodiment where transistors are formed, the material layer 134 may comprise a gate dielectric material comprising an insulator and a gate material formed over the gate dielectric material, for example.

A layer of photosensitive material 136 is deposited over the material layer 134. The layer of photosensitive material 136 may comprise a photoresist, for example. The layer of photosensitive material 136 is patterned using the lithography mask 100 of FIG. 4 or 6 (or masks 200, 300, 400, or 500 of FIGS. 9, 10, 11, and 15, respectively, to be described further herein) to form a latent pattern for the plurality of features to be formed in the material layer 134. The layer of photosensitive material 136 is developed, as shown in FIG. 7.

In some embodiments, the layer of photosensitive material 136 is used as a mask while the material layer 134 is etched using an etch process, forming a plurality of features in the material layer 134, as shown in a cross-sectional view in FIG. 8. The layer of photosensitive material 136 is then removed Advantageously, a plurality of first features and a plurality of second features may be formed, wherein at least one first feature comprises a first dimension and at least one second feature comprises a second dimension, wherein the second dimension is substantially the same as the first dimension, due to the novel polarization-rotating masks 100, 200, 300, 400, and 500 of embodiments of the present invention, for example.

In other embodiments, the layer of photosensitive material 136 is used as a mask to affect an underlying material layer 134 of the semiconductor device 130, for example. Affecting the material layer 134 may comprise etching away exposed portions of the material layer 134, implanting a substance such as a dopant or other materials into the exposed portions of the material layer 134, or forming a second material layer over exposed portions of the material layer 134, as examples (not shown), although alternatively, the material layer 134 may be affected in other ways.

The polarization rotating material 108 alters or adjusts the polarization of the light 138 in region 133 which corresponds to the first region 102 of the mask 100. The polarization of the light in region 135 which corresponds to the second region 104 of the mask 100 is not affected, because the polarization rotating material 108 is not present in the path of the light 138 in the second region 104 of the mask 100.

As an example, the first region 102 of the mask 100 may comprise a pattern for vertical features oriented in a y direction, and the second region 104 of the mask 100 may comprise a pattern for horizontal features oriented in an x direction. The polarization rotating material 108 may be adapted to rotate a polarization of light 138 by 90 degrees in this example. If light 138 polarized in the x direction is used in the exposure process to pattern the semiconductor device 130, the light 138 is allowed to pass through the patterns for features in the second region 104 of the mask 100 with an unchanged polarization, so that horizontal features in region 135 of the semiconductor device 130 are exposed with light polarized in the x direction. However, light 138 impinging upon the patterns for vertical features in the first region 102 of the mask 100 is rotated by 90 degrees by the polarization rotating material 108 to the y direction, so that advantageously, vertical features in region 133 of the semiconductor device 130 are exposed with light polarized in the y direction. Advantageously, only one mask 100 may be used to pattern a semiconductor device 130 having features in more than one orientation, using one exposure process, wherein patterns of regions 102 and 104 are optimally exposed to an optimal polarization rotation due to the rotation of a portion of the light 138 by the polarization rotating material 108 of the novel mask 100.

Features of semiconductor devices 130 manufactured using the novel methods described herein may comprise transistor gates, conductive lines, vias, capacitor plates, and other features, as examples. Embodiments of the present invention may be used to pattern features of memory devices, logic circuitry, and/or power circuitry, as examples, although other types of ICs and devices may also be fabricated using the manufacturing techniques and processes described herein.

Embodiments of the present invention may be used in lithography processes that utilize positive or negative photoresists for patterning semiconductor devices 130, for example.

The lithography masks shown in FIGS. 1 through 4 comprise binary masks wherein the pattern-forming material 110 comprises an absorbing material such as chrome. Embodiments of the present invention may also be implemented in attenuating phase shifting masks, as shown in FIGS. 9 through 15. Like numerals are used for the various elements in FIGS. 9 through 15 that were used to describe the previous figures, and to avoid repetition, each reference number shown in FIG. 9 through 15 is not described again in detail herein. Rather, similar materials x02, x04, x06, x08, etc. . . . are preferably used for the various material layers shown as were described for FIGS. 1 through 8, where x=1 in FIGS. 1 through 8, x=2 in FIG. 9, x=3 in FIG. 10, etc.

Figure 9:
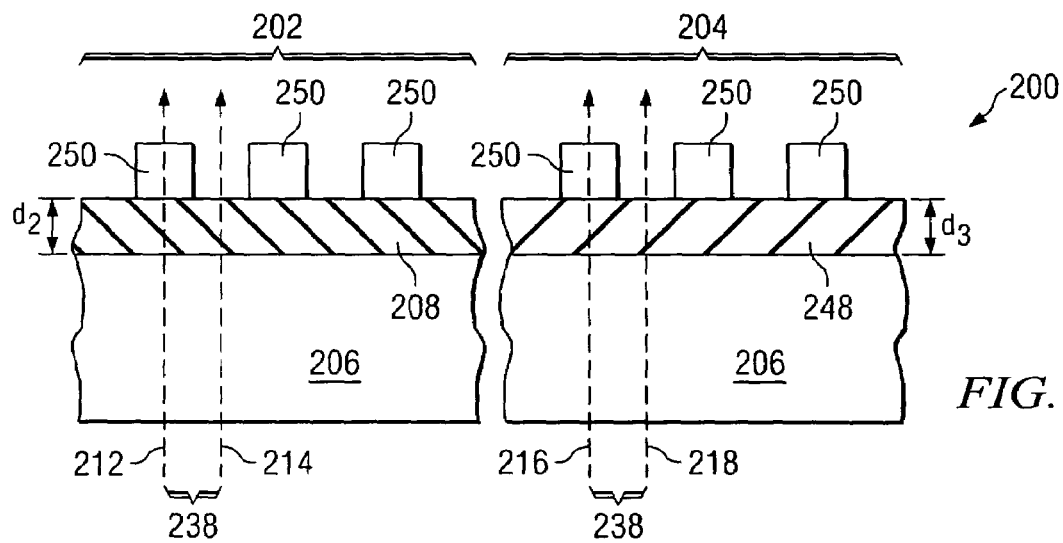
FIG. 9 shows a cross-sectional view of an attenuating phase shifting lithography mask in accordance with an embodiment of the present invention.

FIG. 9 shows a cross-sectional view of an attenuating phase shifting lithography mask 200 in accordance with an embodiment of the present invention. In FIG. 9, the pattern-forming material 250 preferably comprises an attenuating material (also referred to as a halftone (HT) material) such as MoSi, for example. The attenuating material 250 preferably comprises a thickness of about 100 nm or less, and more preferably comprises a thickness of about 10 to 50 nm in some embodiments, for example, although alternatively, the attenuating material 250 may comprise other dimensions. In this embodiment, for example, the pattern-forming material 250 comprises an attenuated phase shift mask (PSM) absorber, and light emerging away from the mask 200 has a 180 degree phase difference between attenuating material 250 covered and the other materials, although the polarization rotating material 208 may also contribute to a phase change.

In the embodiment shown in FIG. 9, a polarization rotating material 208 is formed in the first region 202 of the mask 200, and a non-polarization rotating material 248 is formed in the second region 204 of the mask 200, e.g., over the substrate 206, before the patterning-forming material 250 is deposited. The polarization rotating material 208 may be deposited over the entire mask 200 and then removed from over the second region 204. The non-polarization rotating material 248 is then deposited over the entire mask 200 and is then removed from over the first region 202. Light 238 passes through the first region 202 at areas 212 and 214 and through the second region 204 at areas 216 and 218. The polarization of light 238 is rotated in the first region 202 but not in the second region 204, for example.

The non-polarization rotating material 248 preferably comprises a material that does not affect the polarization of light impinged upon the mask 200, and more preferably comprises a material having a comparable thickness and comparable absorption characteristics as the polarization rotating material 208, for example, in order to achieve optimal focus conditions. Preferably, the thickness $d_2$ of the polarization rotating material 208 and the thickness $d_3$ of the non-polarization rotating material 248 are substantially the same, in some embodiments. In other embodiments, the thickness $d_2$ of the polarization rotating material 208 and the thickness $d_3$ of the non-polarization rotating material 248 preferably do not vary by more than about 100 nm, for example. The balancing of the total light absorption through all layers in region 204 as compared to region 202 will ensure equal exposure dose requirements for identical patterns placed in regions 202 and 204, for example. Small deviations in dose requirements not balanced by absorption adjustment in the non-polarization rotating material 248 may be alleviated by adjustments of mask CDs related to patterns in region 204. By having similar underlayers (e.g., material layers 208 and 248, respectively) below the pattern-forming materials 250 in each of the regions 202 and 204, a phase difference of 180 degrees may be, and is preferably, maintained between areas 212 and 214 and also between areas 216 and 218.

The choice of material for the non-polarization rotating material 248 may depend on the optical properties and chosen thickness of the polarization rotating material 208, for example. Spin-on-glass containing a dye and/or having a predetermined dopant content, for example, may be used as a material for the non-polarization rotating material 248, which provides a high flexibility regarding the proper adjustment of the absorption coefficient and has suitable deposition and removal characteristics. In the case of excessively high absorption, F incorporation into the non-polarization rotating material 248 may help to increase transmissivity for wavelengths of about 200 nm or less, for example. No requirements regarding the refractive index of the non-polarization rotating material 248 may arise if light passing through the polarization rotating material 208 is rotated by 90 degrees (e.g., creating an absence of interference between light of regions 202 and 204). For rotation angles different than 90 degrees, potentially detrimental interference effects may occur, which may be avoided if the refractive index of material 204 is adjusted in such a way that the phase difference in the light paths through regions 202 and 204 remains either 0 or an integer multiple of $2\pi$, for example. This may require a materials optimization for both absorption and refractive indices, for example.

Figure 10:
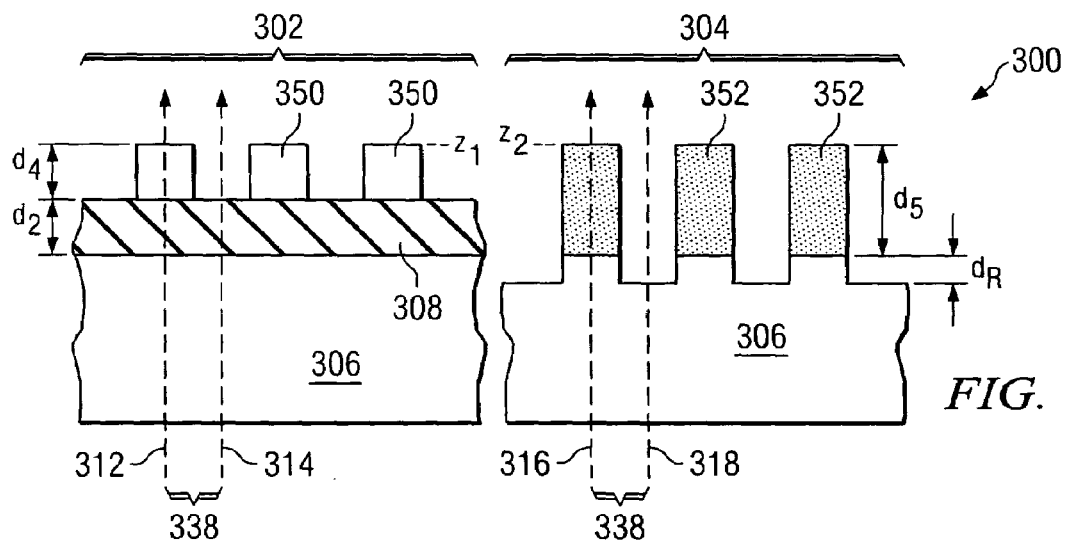
FIG. 10 shows a cross-sectional view of an attenuating phase shifting lithography mask in accordance with another embodiment of the present invention.

FIG. 10 shows a cross-sectional view of an attenuating phase shifting lithography mask 300 in accordance with another embodiment of the present invention. In this embodiment, the polarization rotating material 308 is formed in the first region 302 but not in the second region 304. The pattern-forming material 352 in the second region 304 is preferably thicker than the pattern-forming material 350 in the first region 302, as shown. The pattern-forming material 352 preferably comprises a different attenuating material than the pattern-forming material 350 with an absorption coefficient which is lower than that of material 350 in the first region 302 in this embodiment.

The material selection for the pattern-forming material 352 and potential material adjustment in order to provide suitable values for the absorption coefficient and the refractive index is preferably achieved by substantially meeting two conditions: first, at a thickness of $d_5=d_2+d_4$, wherein $d_2$ is the thickness of the patterning-forming material 350 in the first region 302, $d_4$ is the thickness of the polarization rotating material 308 in the first region 302, and $d_5$ is the thickness of the pattern-forming material 352 in the second region 304, the pattern-forming material 352 exhibits the same amount of light attenuation as the pattern-forming material 350 having the thickness $d_4$ in region 302; and second, a phase angle difference of 180 degrees is maintained between light passing through the mask areas 316 of region 304 covered with material 352 and light passing through the adjacent areas 318 not covered by material 352.

The fulfillment of the first condition mentioned above ensures that the top surfaces $z_1$ and $z_2$ of the pattern-forming materials 350 and 352, respectively, remain at substantially the same height. Thereby, requirements for the best focus position for regions 302 and 304 remain identical, and a degradation in the overall depth of focus budget for the entire mask 300 is avoided. The fulfillment of the second condition mentioned above ensures that a contrast-enhancing attenuated phase shifter effect is also established in the second region 304, for example.

Note that if the polarization rotating material 308 in the first region 302 is slightly absorbing, the absence of the polarization rotating material 308 in the second region 302 may be compensated for by critical dimension (CD) adjustments in the patterns of the pattern-forming material 352, in order to maintain the same dose requirements for the first region 302 and the second region 304, for example.

In the embodiment shown in FIG. 10, light 338 passes through the first region 302 at areas 312 and 314 and through the second region 304 at areas 316 and 318 of the mask 300. The polarization of light 338 is rotated in the first region 302 but not in the second region 304, for example.

In the case of rotation of the plane of polarized light by 90 degrees by the presence of the polarization rotating material 308 in region 302, interference between light emitted from regions 302 and 304 will not occur. In order to avoid potentially detrimental interference effects of this nature in the case of polarization rotation angles other than 90 degrees, an additional recess by an amount $d_R$ into the substrate 306 may be included as a means to maintain an optical path difference between light emitted from the attenuator-free areas 314 and 318 (i.e., the areas 314 and 318 not including materials 350 and 352 which are attenuating, respectively) of regions 302 and 304, respectively, at 0 or integer multiples of the exposure wavelength $\lambda$. The amount of recess $d_R$ or over-etch of the substrate 306 in region 304 in this embodiment may be calculated using Equation 4:

$$d_R = [n\lambda - d_2(n_2 - n_a)]/(n_s - n_a); \qquad \text{Eq. 4:}$$

wherein $d_R$ is the depth of recess of the substrate 306, wherein $n_2$ and $d_2$ are the refractive index and the thickness, respectively, of the polarization rotating material 308, wherein $n_s$ is the refractive index of the mask 300 substrate 306, wherein $n_a$ is the refractive index of the gaseous ambient around the mask, wherein $\lambda$ is the exposure wavelength, and wherein n is an integer (1, 2, 3 . . . ).

Figure 11:
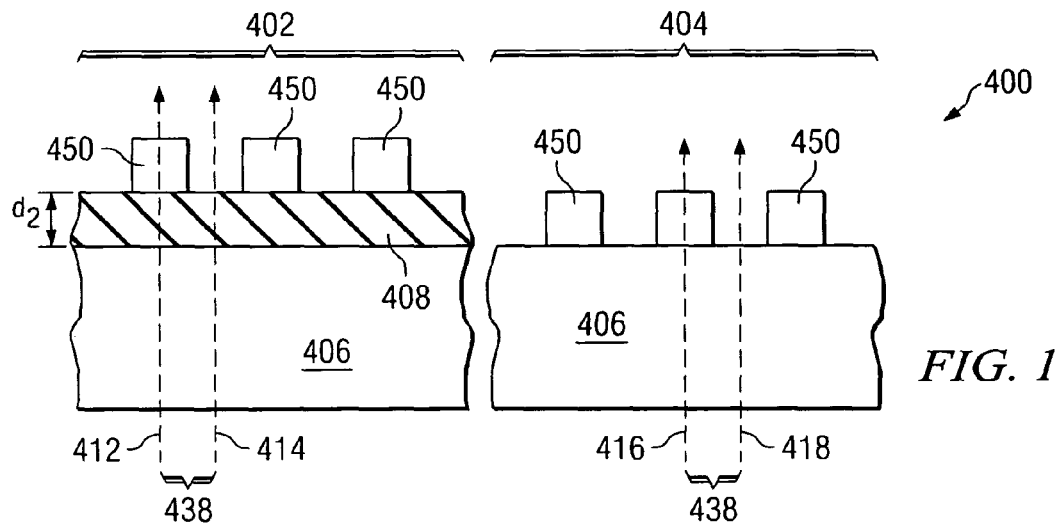
FIG. 11 shows a cross-sectional view of an attenuating phase shifting lithography mask in accordance with yet another embodiment of the present invention.
Figure 12:
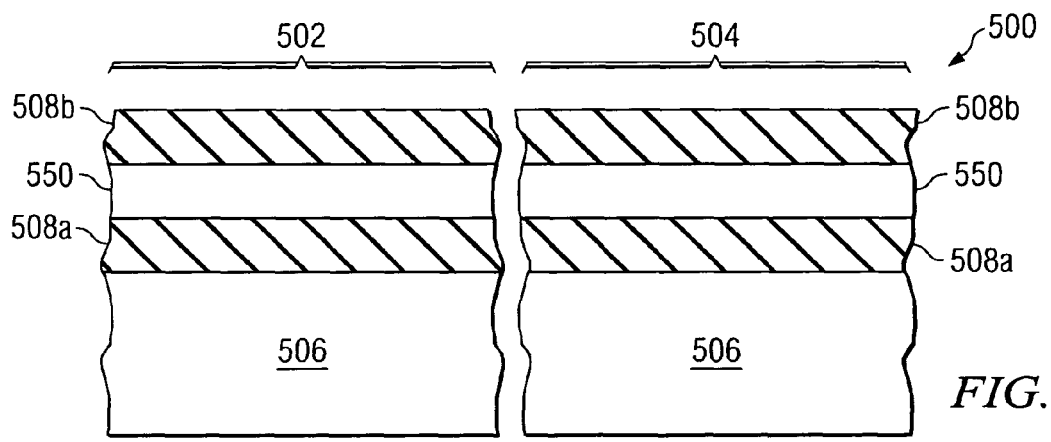
FIGS. 12 through 15 show cross-sectional views of an attenuating phase shifting lithography mask in accordance with an embodiment of the present invention at various stages of manufacturing.

FIG. 11 shows a cross-sectional view of an attenuating phase shifting lithography mask 400 in accordance with another embodiment of the present invention. In this embodiment, the same pattern-forming material 450 is used in the first region 402 and the second region 404, and the polarization rotating material 408 is formed only in the first region 402. Preferably, the polarization rotating material 408 comprises a thickness of about 200 nm or less, and more preferably comprises a thickness of about 100 nm or less, in this embodiment, in order to avoid depth of focus (DOF) latitude issues due to different positions of the top surfaces of the mask 400 in the first and second regions 402 and 404, respectively, due to the absence of the polarization rotating material 408 in the second region 404.

Light 438 passes through the first region 402 at areas 412 and 414 and through the second region 404 at areas 416 and 418. The polarization of light 438 is rotated in the first region 402 but not in the second region 404, for example.

FIGS. 12 through 15 show cross-sectional views of an attenuating phase shifting lithography mask 500 in accordance with an embodiment of the present invention at various stages of manufacturing. In this embodiment, two polarization rotating material layers 508a and 508b, are employed in the mask architecture. The polarization rotating material layers 508a and 508b may comprise either two different materials with differing polarization rotating properties or, alternatively, they may comprise the same type of polarizing rotating film material, but with differing thickness requirements for layers 508a and 508b, to be described herein in more detail.

For example, a first polarization rotating material 508a is disposed over a substrate 506, a pattern-forming material 550 comprising an attenuating material is disposed over the first polarization rotating material 508a, and a second polarization rotating material 508b is disposed over the pattern-forming material 550. If the first polarization rotating material 508a induces a rotation of the polarization plane by β degrees, then the properties and thickness of the second (upper) polarization rotating material 508b are preferably chosen to induce an additional rotation of the polarization plane by either (−β) or (360−β) degrees, for example. This ensures that the light 538 passing through the complete mask stack (e.g., material layers 508a, 550, and 508b) in area 516 will not be subjected to any rotation of its polarization plane at all, as experienced by light passing through section 518 in region 504.

Figure 15:
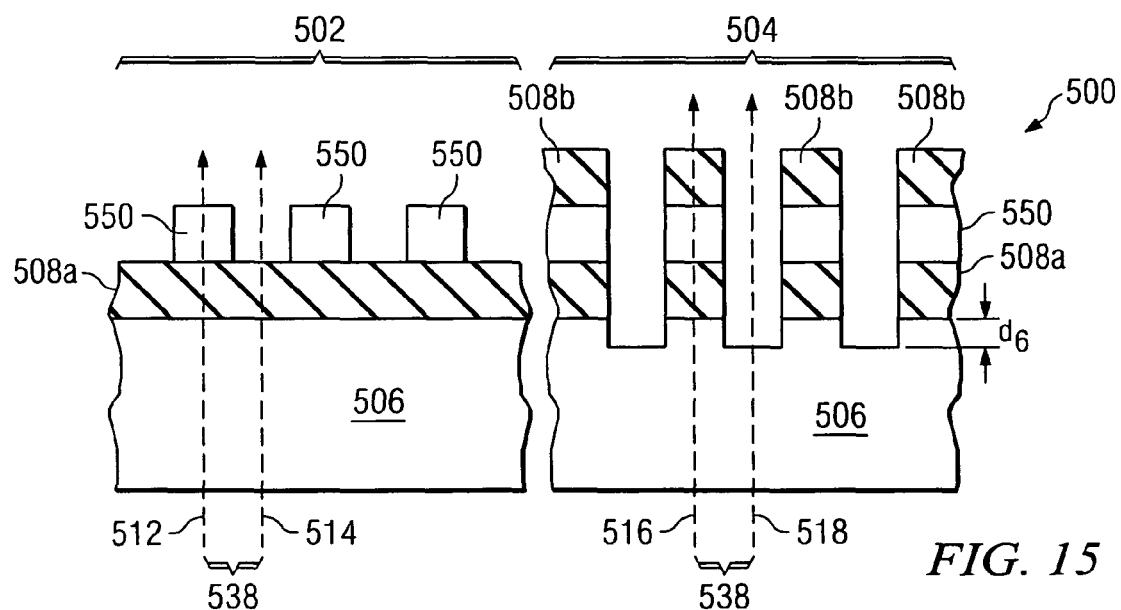

Full exploitation of the contrast-enhancing effect of the phase shifting mask concept depends on the presence of a 180 degree phase shift between mask areas 512 and 516 (see FIG. 15) covered with the attenuated and absorber material comprising the pattern-forming material 550 and adjacent areas 514 and 518 free of the absorber material 550. This condition is preferably also fulfilled for light passing through areas 516 and 518 and can be met by forming a recess $d_6$ in the substrate 506 in area 118 of region 504, as shown in FIG. 15. The amount of recess $d_6$ may be determined using Equation 5:

$$(d_{PRM2}n_{PRM2}+d_{ATT}n_{ATT}+d_{PRM1}n_{PRM1}+d_R n_s)-(d_{PRM2}+d_{ATT}+d_{PRM1}+d_6)n_a=(\lambda/2)(2n-1);$$ Eq. 5:

for n=1, 2, 3 . . . , wherein $d_{PRM1}$ and $n_{PRM1}$ are the thickness and refractive index, respectively, of the first (lower) polarization rotating material 508a, wherein $d_{PRM2}$ and $n_{PRM2}$ are the thickness and refractive index of the second (upper) polarization rotating material 508b; wherein $d_{ATT}$ and $n_{ATT}$ are the thickness and refractive index, respectively, of the attenuating film or the pattern-forming material 550; wherein $n_s$ is the refractive index of the mask substrate 506 material, and wherein $n_a$ is the refractive index of the gaseous ambient surrounding the mask 500, for example.

Figure 13:
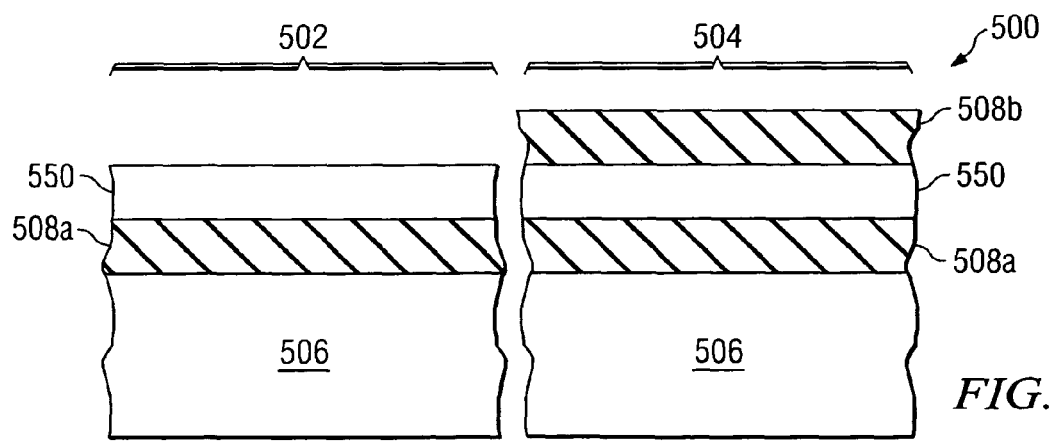

Solving Equation 5 for the required recess depth $d_6$ of the substrate 506 in the second region 504 results in Equation 6:

$$d_6=((2n-1)(\lambda/2)-d_{PRM2}(n_{PRM2}-n_a)-d_{ATT}(n_{ATT}-n_a)-d_{PRM1}(n_{PRM1}-n_a))/(n_s-n_a)$$ Eq. 6:

For polarization rotation different than 90 degrees, an alternative requirement for the recess depth $d_6$ of the substrate 506 may be used, in order to ensure the absence of potentially detrimental interference effects between regions 502 and 504 of the mask. The recess depth $d_6$ of the substrate 506 may be calculated using Equation 7 in these embodiments, below:

$$d_6=(n\lambda-d_{PRM1}(n_{PRM1}-n_a))/(n_s-n_a).$$ Eq. 7:

To manufacture the mask 500, after depositing the second polarization rotating material 508b, the second polarization rotating material 508b is removed from over the first region 502, as shown in FIG. 13, e.g., by depositing a layer of photoresist (not shown) over the second polarization rotating material 508b, patterning the layer of photoresist, and using the layer of photoresist as a mask while portions of the second polarization rotating material 508b in the first region 502 are etched away.

Figure 14:
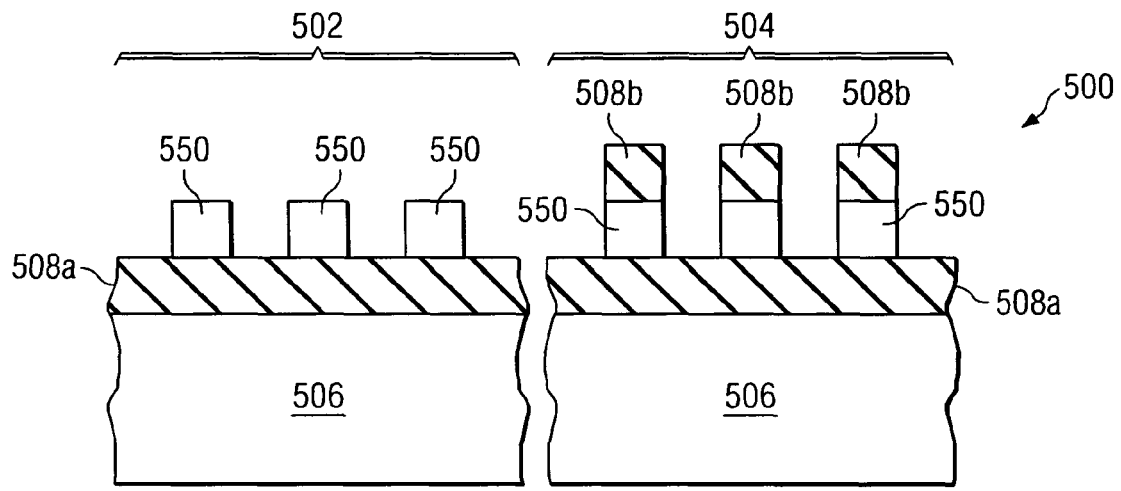

The pattern-forming material 550 in the first region 502 and the second polarization rotating material 508b and pattern-forming material 550 in the second region 504 are patterned with a desired pattern, as shown in FIG. 14. The first region 502 is masked (not shown) and the second polarization rotating material 508b is patterned in the second region 504, as shown in FIG. 15.

Light 538 passes through the first region 502 at areas 512 and 514 and through the second region 504 at areas 516 and 518. The polarization of light 538 is rotated in the first region 502 in areas 512 and 514 by the first polarization rotating material 508a. The polarization of light is rotated in the second region 504 by both the first and second polarization rotating materials 508a and 508b in area 516 but not in area 518, for example.

In this embodiment, the substrate 506 may be recessed in areas 518 by an amount $d_6$ determinable by Equations 6 or 7 above in the second region 504 in order to ensure maximum contrast enhancement by the attenuated phase shifter (e.g., the pattern-forming material 550) in region 504 and to avoid potentially image degrading interference effects between regions 502 and 504, for example.

Advantages of embodiments of the invention include providing novel lithography masks 100, 200, 300, 400, and 500 and methods of fabrication thereof that allow polarized light processing for high contrast imaging for differently oriented features. High contrast images of two orthogonal features, or other angles depending on the active polarizer (e.g., the polarization rotating material 108, 208, 308, 408, 508a or 508b) capability, may be made with a single exposure process using polarized light.

Embodiments of the present invention allow chip designers the ability to use virtually any orientation of features, such as gates having the same across-the-chip line width variation (ACLV), which results in an increase in throughput and thus a reduction in costs. Contrast in the exposure process is improved, resulting in increased resolution and the ability to print smaller features.

Embodiments of the present invention include manufacturing process flows for lithography masks 100 that ensure appropriate control of the phase shift despite the presence of an additional polarization-rotating film, e.g., polarization rotating materials 108, 208, 308, 408, 508a, and 508b. Advantageously, regions of features may be individually custom polarized with a desired polarization, using the novel lithography masks 100 described herein. Features aligned in different directions of semiconductor devices 130 may be exposed with light polarized differently in various regions 133 and 135, for example (see FIG. 8). Advantageously, a plurality of first features and a plurality of second features may be formed in a material layer 134, wherein the first features and second features have different orientations. The first features may comprise a first dimension and the second features may comprise a second dimension, the second dimension being substantially the same as the first dimension.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a lithography mask, the method comprising:
    providing a substrate;
    forming a first pattern in a first region of the substrate;
    forming a second pattern in a second region of the substrate, the second pattern comprising patterns for features oriented differently than patterns for features of the first pattern; and
    forming a polarization rotating material over the substrate wherein the polarization rotating material rotates a polarized light, wherein forming the polarization rotating material comprises forming the polarization rotating material over the entire substrate, and removing the polarization rotating material from over at least portions of the second region of the substrate, leaving the polarization rotating material over the first region of the substrate.

2. The method according to claim 1, wherein forming the polarization rotating material comprises forming the polarization rotating material over the first region of the substrate but not over at least portions of the second region of the substrate.

3. The method according to claim 2, wherein forming the polarization rotating material over the first region of the substrate but not over at least a portion of the second region of the substrate comprises forming the polarization rotating material adapted to shift a phase of polarized light in the first region by a first amount, and wherein removing the portion of the substrate in the second region of the substrate comprises removing a portion of the substrate such that the substrate in the second region is adapted to compensate for the shift of a phase of polarized light by the first amount in the second region.

4. The method according to claim 1, further comprising removing a portion of the substrate in the second region of the substrate.

5. The method according to claim 1, wherein forming the polarization rotating material comprises:
    forming the polarization rotating material over the first region of the substrate and forming a non-polarization rotating material over the second region of the substrate, the non-polarizing rotating material comprising substantially the same thickness as the polarization rotating material.

6. The method according to claim 1, wherein forming the polarization rotating material comprises forming a first polarization rotating material over the first region of the substrate but not the second region of the substrate, wherein forming the first pattern in the first region of the substrate comprises forming the first pattern in a first material, wherein forming the second pattern in the second region of the substrate comprises forming the second pattern in a second material, the second material being different than and comprising a greater thickness than the first material.

7. The method according to claim 1, wherein forming the polarization rotating material comprises forming a first polarization rotating material over the first region and the second region of the substrate, and forming a second polarization rotating material over the second region of the substrate.

8. A method of manufacturing a binary lithography mask, the method comprising:
    providing a substrate, the substrate comprising a first region and a second region;
    disposing a polarization rotating material over the entire substrate;
    disposing an opaque material over the polarization rotating material;
    removing a portion of the opaque material in the first region and the second region, forming a first pattern in the first region of the substrate and forming a second pattern in a second region of the substrate, the second pattern comprising patterns for features oriented differently than patterns for features of the first pattern;
    removing the polarization rotating material from over a first area of the second region, leaving the polarization rotating material in a second area of the second region, wherein the first area comprises the second region not beneath the opaque material, and wherein the second area comprises the second region beneath the opaque material; and
    removing a portion of the substrate in the first area of the second region.

9. The method according to claim 8, wherein the polarization rotating material comprises a birefringent material and/or an optically active material of an inorganic or organic nature.

10. The method according to claim 8, wherein the polarization rotating material is adapted to alter a polarization by about 0 to 180 degrees.

11. The method according to claim 8, wherein removing the portion of the substrate in the first area of the second region comprises recessing the substrate in the first area of the second region by an amount $t_R$ calculatable using Equation 2:

$$t_R = [t_{PRM}(N_{PRM} - n_a) - n\lambda]/(n_s - n_a) \qquad \text{Eq. 2:}$$

for n=0 or 1, wherein $t_{PRM}$ is the thickness of the polarization rotating material, wherein $\lambda$ is the exposure wavelength of light that will be used in an exposure process with the mask, and wherein $n_{PRM}$, $n_s$ and $n_a$ are the refractive indices of the polarization rotating material, the substrate, and a gas ambient surrounding the mask during an exposure process using the mask, respectively.

12. A method of manufacturing an attenuating phase shifting lithography mask, the method comprising:
providing a substrate, the substrate comprising a first region and a second region;
disposing a polarization rotating material over at least the first region of the substrate;
forming a non-polarization rotating material over the second region but not the first region of the substrate, before disposing an attenuating material;
disposing the attenuating material over the polarization rotating material; and
removing a portion of the attenuating material in the first region and the second region, forming a first pattern in the first region of the substrate and forming a second pattern in the second region of the substrate, the second pattern comprising patterns for features oriented differently than patterns for features of the first pattern are oriented, wherein the lithography mask is adapted to affect a polarization rotation of light differently in the first region than in the second region.

13. The method according to claim 12, wherein the polarization rotation of light is affected differently in the first region than in the second region by forming the polarization rotating material over the first region of the substrate but not over at least a portion of the second region of the substrate.

14. The method according to claim 12, wherein disposing the polarization rotating material over at least the first region of the substrate comprises forming the polarization rotating material over the first region of the substrate but not the second region of the substrate, wherein providing the first pattern in the first region of the substrate comprises forming the first pattern in a first attenuating material, wherein providing the second pattern in the second region of the substrate comprises forming the second pattern in a second attenuating material, the second attenuating material being different than and comprising a greater thickness than the first attenuating material.

15. The method according to claim 14, wherein the thickness of the second attenuating material in the second region is substantially the same as the thickness of the first attenuating material and the thickness of the polarization rotating material in the first region.

16. The method according to claim 12, further comprising disposing a first polarization rotating material over the entire substrate, disposing the attenuating material over the first polarization rotating material, disposing a second polarization rotating material over the attenuating material, removing the second polarization rotating material from over the first region of the substrate, patterning the attenuating material in the first region with the first pattern and patterning the second polarization rotating material and attenuating material in the second region with the second pattern, and patterning the first polarization rotating material in the second region with the second pattern.

17. The method according to claim 16, further comprising patterning a portion of the substrate in the second region with the second pattern.

18. A lithography mask, comprising:
a plurality of patterns for features disposed in a first region and a second region;
a polarization rotating material disposed in at least the first region, the polarization rotating material being adapted to alter a polarization and a phase of light in at least the first region; and
a phase shifting compensating feature disposed in at least portions of the second region adapted to compensate for the altered phase of light due to the polarization rotating material in the first region.

19. The lithography mask according to claim 18, wherein the polarization rotating material comprises a thickness of about 300 nm or less.

20. The lithography mask according to claim 19, further comprising a non-polarization rotating material disposed in at least a part of the second region, wherein the non-polarization rotating material and the polarization rotating material comprise substantially the same thickness.

21. The lithography mask according to claim 18, wherein the plurality of patterns for features is formed in an attenuating or opaque material disposed over or under the polarization rotating material.

22. The lithography mask according to claim 18, wherein the polarization rotating material comprises $SiO_2$, $CaCO_3$, $TiO_2$, $\beta\text{-}BaB_2O_4$, a cholesteric liquid crystal film with a helical structure, an optically active alicyclic polymer, an optically active siloxane, an optically active organic material or compound, or a fluorine-containing organic material.

23. The lithography mask according to claim 18, wherein being adapted to alter the polarization of light comprises rotating the polarization of light.

24. The lithography mask according to claim 18, further comprising a polarizing filter material adapted to polarize light and disposed on the first region and the second region.

25. A lithography mask, comprising:
a substrate comprising a first region and a second region;
a polarization rotating material disposed on at least the first region, the polarization rotating material being adapted to rotate light in at least the first region; and
a first pattern in the first region and a second pattern in the second region disposed on the polarization rotating material, wherein the polarization rotating material is disposed in the second region under the second pattern, but is not disposed a remaining portion of the second region not under the second pattern.

26. The lithography mask according to claim 25, wherein the pattern of the first region is orthogonal compared to the pattern of the second region.

27. The lithography mask according to claim 25, further comprising a polarizing filter material layer and wherein the polarizing filter material layer is arranged under the substrate.

28. The lithography mask according to claim 25, wherein the first pattern and the second pattern comprise an attenuating material.

29. The lithography mask according to claim 25, wherein the second pattern also comprises a portion of the substrate of the second region and wherein the pattern in the second region is thicker than the pattern in the first region.

30. The lithography mask according to claim 25, further comprising a second polarization rotating material disposed over both the first region and the second region.

* * * * *